Jan. 28, 1969 H. MICHEL ETAL 3,424,627

PROCESS OF FABRICATING A METAL BASE TRANSISTOR

Filed Dec. 10, 1965 Sheet 1 of 3

INVENTORS
Hartmut Michel &
Gerd Seiter

BY Spencer & Kaye

ATTORNEYS

INVENTORS
Hartmut Michel &
Gerd Seiter
BY Spencer & Kaye
ATTORNEYS

PROCESS OF FABRICATING A METAL BASE TRANSISTOR

INVENTORS
Hartmut Michel &
Gerd Seiter
BY Spencer & Kaye
ATTORNEYS

United States Patent Office 3,424,627
Patented Jan. 28, 1969

3,424,627

PROCESS OF FABRICATING A METAL BASE TRANSISTOR

Hartmut Michel, Vaihingen, Enz, and Gerd Seiter, Frankenbach, Germany, assignors to Telefunken Patentverwertungsgesellschaft m.b.H., Elisabethenstrasse, Ulm (Danube), Germany Filed Dec. 10, 1965, Ser. No. 512,889
Claims priority, application Germany, Dec. 15, 1964, T 27,622
U.S. Cl. 148—174 20 Claims
Int. Cl. H01l 7/50

The present invention relates to a semiconductor device, and particularly to the production of a metal base transistor.

As is presently known, a metal base transistor comprises two semiconductor electrodes separated from each other by a metallic layer about 100 A. thick with which layer they form metal semiconductor junctions. In this arrangement, the metallic layer functions as a base, while the semiconductor electrodes take over the functions of the emitter and collector, respectively, of the transistor. The current from the emitter to the collector traverses the base in the form of "hot electrons." The selection of the metal for the base is made with a view toward providing suitable Schottky barriers at the emitter and collector junctions and a high permeability to hot electrons. The good conductivity of the metal base and the short switching times at the metal semiconductor junctions make it possible to utilize the metal base transistor at substantially higher frequencies than other types of transistors.

The emitter and the collector of a metal base transistor are preferably made of monocrystalline semiconductor material. For producing such a metal base transistor, the metal base is, for example, placed on a monocrystalline semiconductor support body which serves as the collector, and a semiconductor layer is deposited on the base in a monocrystalline manner to form the emitter. This deposition can be effectuated, for example, by a pyrolytic decomposition of a semiconductor compound. The above-described process does not permit the masking of portions of the metal base during the depositing of the semiconductor layer in order to prevent semiconductor material from being deposited on the points to be contacted on the metal base. Therefore, it is difficult to effectuate a subsequent contact to the very thin metal base.

A possible technique for contacting the metal base consists in subsequently uncovering the metal base by an etching process so as to permit contact to be made to the base. However, there are practically no etching solutions in existence which remove the semiconductor material without at the same time attacking the thin metal base. On the other hand, if attempts are made, for example, to contact the metal base by means of diffusion through the last deposited semiconductor layer, the conductivity type of the diffusion zones must be opposite from that of the semiconductor layer in order to prevent the creation of a short circuit with the semiconductor layer. Such a procedure, however, creates diffusion capacitances of the type which normally exists at pn junctions.

It is therefore an object of the present invention to eliminate the above-noted drawbacks.

It is a more specific object of the present invention to prevent the etching away of the metal transistor base during the etching of the semiconductor material forming a portion of the transistor.

It is another object of the present invention to provide an etched resistance metallic coating to protect the metal transistor base.

In accordance with the present invention, a transistor is fabricated by providing a first semiconductor body which constitutes a first transistor region and by disposing an etchant-resistant metallic coating and a metal layer on the first body. The exposed surfaces of the coating and the metal layer, which constitutes a second transistor region, are then covered by a second semiconductor body which constitutes a third transistor region, and part of at least this second body is etched away to expose an electrode contact surface of the metallic coating.

The present invention also includes a metal base transistor having a first layer of semiconductor material constituting a first transistor region, a metal layer constituting a second transistor region and disposed at least partially on the first layer, and an etchant-resistant metallic coating disposed in contact with a portion of the metal layer. In accordance with one preferred embodiment of the present invention, the metallic coating is disposed on the first layer and the metal layer is disposed partially on the metallic coating and partially on the first layer. In accordance with another embodiment of the present invention, the metal layer is disposed on the first layer and the metallic coating is then placed on the metal layer so as to cover a portion of that layer. In accordance with still another embodiment of the present invention, the metallic coating is separated from the first layer by a layer of insulating material and an intermediate layer which increases the adhesion of the metallic coating to the unit, while the metal layer is then disposed partially on the metallic coating and partially on an exposed portion of the first layer.

Additional objects and advantages of the present invention will become apparent upon consideration of the following description when taken in conjunction with the accompanying drawings in which.

Figure 1:
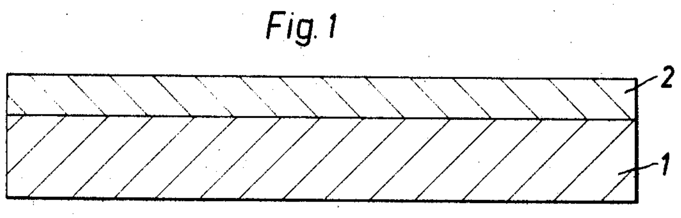
FIGURE 1 is a cross-sectional elevational view showing a first stage in the production of a transistor according to one embodiment of the present invention.

Referring now specifically to FIGURES 1 to 5, FIGURE 5 shows the completed transistor assembly produced according to one embodiment of the present invention. As is shown in FIGURE 1, the fabrication of this transistor begins with the provision of a low resistance silicon semiconductor support body 1, having a resistivity of the order of 0.001 ohm-cm., on which is epitaxially deposited a layer 2 of semiconductor material, having a resistivity of the order of 0.5 ohm-cm., which layer 2 is intended to serve as the transistor collector. The semiconductor layer 2 may be formed on the support layer 1 by a pyrolytic decomposition of silicon tetrachloride, for example. The collector layer 2 preferably has a thickness of the order of 5$\mu$ and has a lower conductivity than the support body 1.

Figure 2:
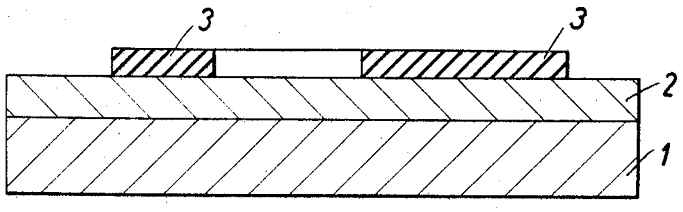
FIGURE 2 is a view similar to that of FIGURE 1 showing a further stage in the production of the transistor.

Then, as is shown in FIGURE 2, a metallic coating 3, which is preferably made of a noble metal such as rhodium or platinum, for example, is provided on the collector layer 2. The layer 3 may be formed by first providing a suitable metal mask on the layer 2 and by then evaporating the coating 3 onto the layer 2 through the openings provided in the mask. As indicated in FIGURE 2, the metallic coating of the present embodiment is given a generally annular shape and has a laterally enlarged area in the region where a low resistance base contact is to be made. The coating 3 preferably has a thickness of the order of 1$\mu$ for example.

Figure 3:
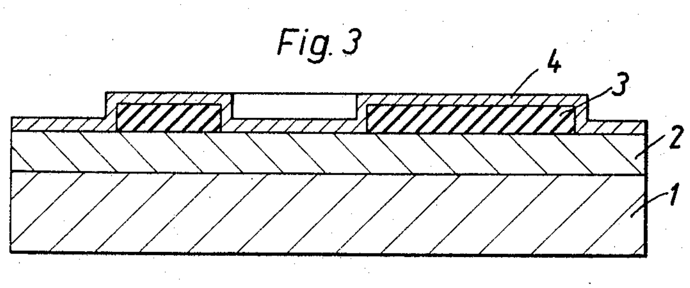
FIGURE 3 is a view similar to that of FIGURE 1 showing a still further stage in the production of the transistor.

Thereafter, as is shown in FIGURE 3, a metal layer 4 is deposited on the coating 3 and the exposed surface portions of the collector layer 2. This metal layer 4, a portion of which is to constitute the transistor base, can be made of molybdenum and is formed for example, by the evaporation of molybdenum or by a pyrolytic decomposition of molybdenum chloride.

Figure 4:
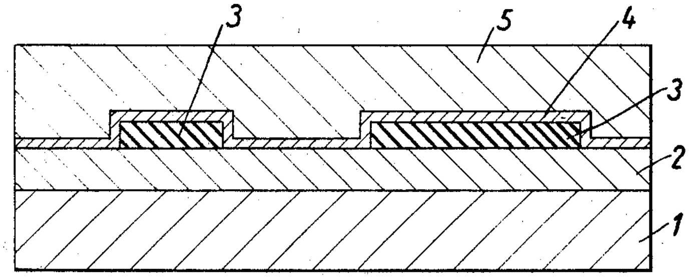
FIGURE 4 is a view similar to that of FIGURE 1 showing yet another stage in the production of the transistor.

As is shown in FIGURE 4, a layer 5 of monocrystalline semiconductor material is then deposited on the metal base 4. The layer 5 is preferably made of silicon and can be formed, for example, by a pyrolytic decomposition of silicon tetrachloride. This layer 5 preferably has a thickness of about 3$\mu$ and a resistivity of the order of 1 ohm-cm. It should be noted that the upper surface of the layer 5 will tend to reproduce the irregular configuration of the layer 4. However, when the thickness of the semiconductor layer 5 is relatively great, the amplitude of its surface irregularities will become negligible.

Figure 5:
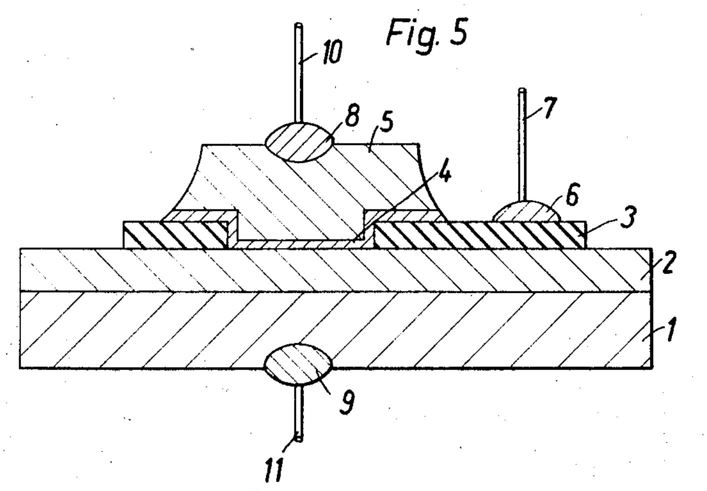
FIGURE 5 is a view similar to that of FIGURE 1 showing the completed transistor produced according to the process illustrated in FIGURES 1 to 4.

Then, the upper surface of the layer 5 is provided with a suitable mask by the photo-resistive technique and is etched away, starting from the unmasked portions of its upper surface, to produce the mesa-type emitter region 5, as is shown in FIGURE 5. It may be noted that portions of the base layer 4 are also removed during this etching process. Thus, portions of the metallic coating 3 are exposed for permitting the attachment of a base contact consisting of an electrode 6 to which a lead wire 7 is attached. The emitter and collector zones of the transistor are suitably contacted by electrodes 8 and 9, respectively, to which lead wires 10 and 11, respectively, are attached.

It may be noted that the dimensions of the circular opening in the metallic coating 3 determines the effective contact area between the metal base and the transistor emitter and collector regions, and that since the metallic coating 3 is in direct contact with the base 4, this coating functions as the base electrode. This later relation is true for all metal base transistors manufactured in accordance with the present invention.

Since the metallic coating 3 is made of a metal such as rhodium or platinum, it will not be attacked by the etchant used for etching away portions of the layer 5 and the metal layer 4. In addition, because the remaining portion of the base layer 4 extends over a portion of the metallic coating 3, this later coating forms a good low resistance contact with the base 4 and thus provides a good contact between the electrode 6 and the base 4.

Figure 6:
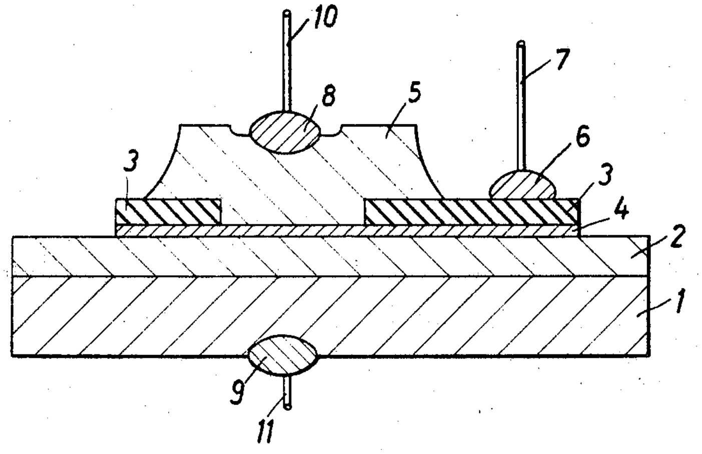
FIGURE 6 is a view similar to that of FIGURE 5 showing another transistor produced according to the present invention.

Turning now to FIGURE 6, the transistor shown therein differs from that of FIGURE 5 only in that the metal base layer 4 is first deposited on the collector layer 2 and the metallic coating 3 is then placed on the layer 4. The etching of the emitter 5 is carried out in the same way as for the device of FIGURE 5. However, in this case the base 4 is completely protected from the action of the etchant used on the emitter layer 5.

Figure 7:
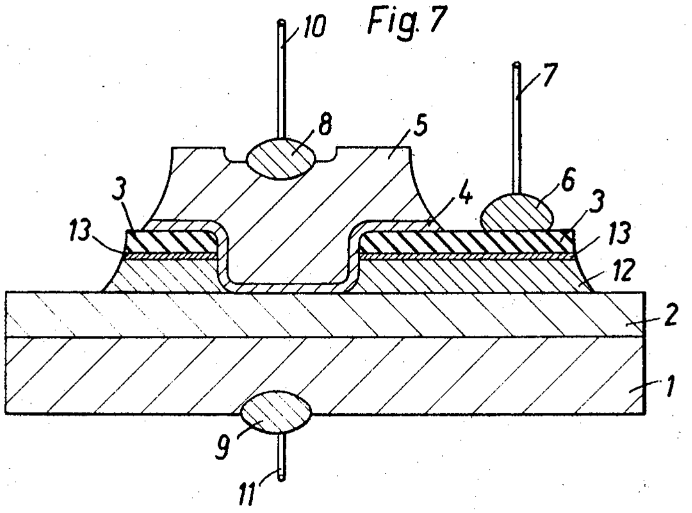
FIGURE 7 is a view similar to that of FIGURE 5 showing yet another transistor produced according to the present invention.

Referring now to FIGURE 7, there is shown yet another transistor produced according to the present invention in which, after the collector layer 2 has been provided on the supporting layer 1, and insulating layer 12 having substantially the same dimensions as the subsequently applied metallic coating 3 is first deposited on the collector layer 2. This insulating layer 12 is provided in order to insulate the metallic coating 3 from the collector 2. After the insulating layer 12 has been deposited in any suitable, well-known manner, an intermediate layer 13 is deposited thereon. This intermediate layer, which preferably has a thickness of the order 0.5$\mu$ and which can be made of a chromium-nickel alloy, for example, is provided in order to present a surface to which the metallic coating 3 can adhere in a satisfactory manner. In this embodiment, the layer 3 can be made, for example, of platinum.

In the production of the transistor of FIGURE 7, a silicon $\mu$ disk 1 has an apitaxially grown layer of semiconductor material 2 disposed thereon and the layer 2 is subjected to an oxidation for producing the insulating layer 12. Thus, the insulating layer 12 is made of silicon dioxide. On this insulating layer 12 the intermediate layer 13 and the metallic coating 3 are deposited, by evaporation for example. The layers 3 and 13 can be given their desired configurations by carrying and evaporating them on with the aid of suitable masks. In the embodiment of FIGURE 7 the coating 3 does not have an annular shape, but is constituted by two isolated portions separated by a space which is to be subsequently filled in by a portion of the emitter layer 5. Using the two portions of the metallic coating 3 as a mask, suitable portions of the insulating layer 12 are etched away in order to give this insulating layer substantially the same configuration as the layers 3 and 13, as is shown in FIGURE 7. After the etching away of the desired portions of the insulating layer 12, the metal base 4 is deposited on the metallic coating 3 and on the exposed portion of the collector 2 in the region between the two sections of coating 3. The emitter 5 is then provided by the suitable deposition of a layer of semiconductor material and by etching away portions of this layer in order to leave the portion shown in FIGURE 7. Finally, the contacts 6, 8 and 9 and their respective lead wires 7, 10 and 11 are provided in the manner described in connection with FIGURE 5.

As has already been noted above, the etchant-resistant metallic coating is preferably made of a noble metal. In addition, it is preferred that the metallic coating be made of material which has a high melting point and which will not diffuse into the semiconductor material on which it is disposed at the temperatures employed for producing the metal base transistor. Furthermore, it is desirable that the material of the metallic coating not form an alloy with the semiconductor material with which it comes in contact. If the material of the metallic coating has properties which border on those of a semiconductor material, it should be of the type of material which forms a rectifying junction with the semiconductor material. If the metallic coating is disposed so as to contact the emitter layer, the metallic coating material is preferably chosen so that, in order to attain a satisfactory current amplification, the Schottky barrier between the metallic coating and the emitter is at least as high as the Schottky barrier between the metal base and the emitter. All of the above-noted properties are exhibited by rhodium and platinum.

It may thus be seen that the present invention provides a method for producing a metal base transistor wherein the presence of the etchant-resistant metallic coating makes possible a subsequent removal of the portions of the semi-conductor material covering the etchant-resistant metallic coating while protecting the relatively sensitive material of the metal base from chemical attack.

It may also be seen that, in accordance with one specific embodiment of the present invention, there is provided a method for producing a metal base transistor in which the metal base is applied to the collector, the etchant-resistant metallic coating is disposed on the metal base, and the emitter layer is disposed partially on the metal base and partially on the etchant-resistant metallic coating. According to this process, a portion of the metallic coating is exposed by etching away that portion of the emitter layer covering the region of the metallic coating to which contact is to be made. By the use of a suitable mask, it is possible to remove only that portion of the emitter layer which is to be eliminated from the finished transistor assembly.

In accordance with another embodiment of the present invention, the etchant-resistant metallic coating is disposed on the collector and the metal base is applied partially to the collector and partially to the metallic coating. In this embodiment, the subsequent etching away of a portion of the emitter layer also serves to etch away a portion of the metal base covering the metallic coating. In this embodiment, it is desirable that the metallic coating form a rectifying junction with the collector in order to prevent the creation of a base collector short circuit. This requirement is fulfilled by the utilization of rhodium or platinum for the etchant-resistant metallic coating.

According to yet another embodiment of the present invention, the metallic coating is not disposed directly on the collector layer, but is disposed on an insulating layer inserted between the collector and metallic layer. In addition, a further, intermediate layer may be inserted between the insulating layer and the metallic layer in order to provide a good adhesion surface for the metallic layer. The insulating layer may be produced by oxidizing the surface of the collector and its presence eliminates the requirement that the metallic coating form a rectifying junction with the collector. In further accordance with this method, the metal base is disposed partially on the metallic coating and partially on the collector. It should be noted that the utilization of an etchant-resistant metallic coating not only protects the metal base from attack during subsequent etching operations, but also serves, because of its configuration, to define the size and shape of the contact area between the metal base and either the emitter or collector layer. For example, when an annular metallic coating is applied on the metal base, which base has been previously disposed on the collector, the contact area between the subsequently applied emitter layer and the metal base will be determined by the configuration of the inner periphery of the metallic layer. This is true if the portion of the emitter, as well as of the metal base, which is laterally outside of the region defined by the metallic coating is removed during the etching operation.

It will be understood that the above description of the present invention is susceptible to various modifications, changes, and adaptations, and the same are intended to be comprehended within the meaning and range of equivalents of the appended claims.

What is claimed is:

1. A method for producing a transistor comprising the steps of:

(a) providing a first semiconductor body which constitutes a first region for said transistor;

(b) depositing a metal layer which constitutes a second region for said transistor and depositing an etchant-resistant metallic coating in contact with one another on said first body;

(c) covering the exposed surfaces of said metal layer and said coating with a second semiconductor body which constitutes a third region for said transistor; and (d) etching away a portion of at least said second body for exposing an electrode contacting surface on said metallic coating.

2. A method as defined in claim 1 comprising the preliminary step of providing a semiconductor support body, and wherein said step of providing a first body is carried out by depositing said first semiconductor body on said support body, said steps of depositing a metal layer and depositing a metallic coating are carried out by depositing said metal layer on said first body and depositing said metallic coating on a portion of said metal layer said step of covering is carried out by depositing said second semiconductor body partially on said metallic coating and partially on an exposed portion of said metal layer; and said step of etching away is carried out by etching away a portion of said second body to expose a contacting surface on said metallic coating.

3. A method as defined in claim 1 comprising the preliminary step of providing a semiconductor support body, and wherein said step of providing a first body is carried out by depositing said first body layer on said support body; said steps of depositing a metal layer and depositing an etchant-resistant coating are carried out by depositing said coating on said first body and depositing said metal layer partially on said first body and partially on said metalllic coating; said step of covering is carried out by depositing said second body on said metal layer; and said step of etching away is carried out by etching away portions of said second body and said metal layer to expose a contacting surface on said metallic coating.

4. A method as defined in claim 1 comprising the preliminary step of providing a semiconductor support body, and wherein said step of providing a first body is carried out by depositing said first body on said support body and depositing an insulating layer on said first body; said steps of providing a metal layer and depositing an etchant-resistant metallic coating is carried out by depositing said metallic coating on a portion of said insulating layer, etching away the portions of said insulating layer which are not covered by said metallic coating to expose a surface portion of said first body and depositing said metal layer partially on said metallic coating and partially on said exposed surface portion of said first body; said step of covering is carried out by depositing said second body on said metal layer; and said step of etching away is carried out by etching away portions of said second body and said metal layer for exposing a contact surface on said metallic coating.

5. A method as defined in claim 4 wherein said semiconductor bodies are made of silicon and said step of providing an insulating layer is carried out by oxidizing the surface of said first body.

6. A method as defined in claim 4 wherein said step of providing an etchant-resistant metallic coating includes the operations of depositing an intermediate layer of a chromium-nickel alloy on said insulating layer and depositing said metallic coating on said intermediate layer, said intermediate layer being provided in order to increase the adhesion of said metallic coating to the assembly.

7. A method as defined in claim 1 wherein said step of etching away includes the operation of removing portions of said second body and said metal layer which are laterally outside of the region defined by said metallic coating.

8. A method as defined in claim 1 wherein the area of contact between said second body and said metal layer is determined by the geometric configuration of said metallic coating.

9. A method as defined in claim 8 wherein said metallic coating has an annular shape and the area of contact between said second body and said metal layer is defined by the inner periphery of said metallic coating.

10. A method as defined in claim 9 wherein said metallic coating has a laterally enlarged portion in the region of its contacting surface.

11. A method as defined in claim 1 wherein said step of depositing a metal layer is carried out by evaporation.

12. A method as defined in claim 1 wherein said step of depositing a metal layer is carried out by pyrolytic decomposition.

13. A method as defined in claim 1 wherein said steps of providing a first body and covering with a second body are carried out by pyrolytic decomposition.

14. A method as defined in claim 1 wherein said metal layer is made of molybdenum.

15. A method as defined in claim 1 wherein said etchant-resistant metallic coating is made of a noble metal having a high melting temperature.

16. A method as defined in claim 1 wherein said metallic coating is of a noble metal which does not form an alloy with the semiconductor material of said transistor and which does not diffuse into the semiconductor material.

17. A method as defined in claim 1 wherein said metallic coating is made of a noble metal which forms a higher Schottky barrier with the semiconductor material with which it is in contact than does said metal layer.

18. A method as defined in claim 1 wherein said metallic coating is made up of a noble metal which forms a rectifying junction with the semiconductor material with which it is in contact.

19. A method as defined in claim 1 wherein said metallic coating consists of rhodium or platinum.

20. A method as defined in claim 1 comprising the preliminary step of providing a semiconductor support body and wherein said step of providing a first body is carried out by depositing said first body on said support body said first body having a higher resistivity than said support body.

References Cited

UNITED STATES PATENTS

| | | | |
|---|---|---|---|
| 3,121,809 | 2/1964 | Atalla | 317—235 XR |
| 3,250,966 | 5/1966 | Rose | 148—33 XR |
| 3,250,967 | 5/1966 | Rose | 317—234 |
| 3,254,276 | 5/1966 | Schwarz et al. | 317—235 |
| 3,322,581 | 5/1967 | Hendrickson et al. | 148—175 |
| 3,324,362 | 6/1967 | Tassara | 317—235 XR |
| 3,258,663 | 6/1966 | Weimer | 317—235 |
| 3,287,186 | 11/1966 | Minton et al. | 148—174 |
| 3,372,069 | 3/1968 | Bailey et al. | 148—175 |
| 3,375,418 | 3/1968 | Garnache et al. | 317—235 |

L. DEWAYNE RUTLEDGE, *Primary Examiner.*

P. WEINSTEIN, *Assistant Examiner.*

U.S. Cl. X.R.

317—235, 234; 148—175, 33; 117—106, 200, 107.2; 156—17; 29—578, 580